(12) United States Patent
Xiao et al.

(10) Patent No.: US 9,773,670 B2
(45) Date of Patent: Sep. 26, 2017

(54) METHOD OF PREPARATION OF III-V COMPOUND LAYER ON LARGE AREA SI INSULATING SUBSTRATE

(71) Applicant: Zing Semiconductor Corporation, Shanghai (CN)

(72) Inventors: Deyuan Xiao, Shanghai (CN); Richard R. Chang, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/067,192

(22) Filed: Mar. 11, 2016

(65) Prior Publication Data

US 2017/0117138 A1    Apr. 27, 2017

(30) Foreign Application Priority Data

Oct. 26, 2015    (CN) .......................... 2015 1 0703722

(51) Int. Cl.
*H01L 21/02*      (2006.01)
*H01L 21/311*     (2006.01)

(52) U.S. Cl.
CPC ...... *H01L 21/0262* (2013.01); *H01L 21/0217* (2013.01); *H01L 21/0254* (2013.01); *H01L 21/02164* (2013.01); *H01L 21/02381* (2013.01); *H01L 21/02488* (2013.01); *H01L 21/02543* (2013.01); *H01L 21/02546* (2013.01); *H01L 21/02549* (2013.01); *H01L 21/02631* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 7,393,738 B1* | 7/2008 | Kim ................ | H01L 21/823412 257/E21.564 |
| 2010/0116632 A1* | 5/2010 | Smith ...................... | B81B 7/04 200/181 |
| 2014/0264657 A1* | 9/2014 | Gogoi ..................... | H01L 27/14 257/416 |
| 2014/0319623 A1* | 10/2014 | Tsai ................ | H01L 21/823462 257/401 |
| 2016/0064284 A1* | 3/2016 | Caimi ................. | H01L 21/8258 257/618 |
| 2016/0155798 A1* | 6/2016 | Borg ................. | H01L 21/02381 257/618 |

* cited by examiner

*Primary Examiner* — Jay C Chang
(74) *Attorney, Agent, or Firm* — Kilpatrick Townsend & Stockton LLP

(57) ABSTRACT

A method for making III-V-on-insulator on large-area Si Substrate wafer by confined epitaxial lateral overgrowth (CELO) has been disclosed. This method, based on selective epitaxy, starting from defining an epitaxy seed window to the Si substrate in a thermal oxide, from which the III-V material will grow.

10 Claims, 4 Drawing Sheets

METHOD OF PREPARATION OF III-V COMPOUND LAYER ON LARGE AREA SI INSULATING SUBSTRATE

The present application claims the priority to Chinese Patent Applications No. 201510703722.8, filed with the Chinese State Intellectual Property Office on Oct. 26, 2015, which is incorporated herein by reference in its entirety.

TECHNICAL FIELD

The present invention relates to the field of semiconductor manufacturing technology, in particular, a method of preparation of III-V compound substrate on an insulator.

BACKGROUND

Integration of high-quality InGaAs on large-area silicon substrates is an effective way of providing high-mobility materials for the development of high performance CMOS technology. Silicon-based materials combining with III-V compound are used to achieve devices and circuits multi-function integration, such as optoelectronic integration, high voltage and low voltage integration, digital-microwave fusion and so on.

Growth of silicon compound semiconductor material on a large-area silicon-based substrate faces many challenges and problems. In the process of hetero-epitaxial growth of III-V compounds on silicon-based substrates, the mismatch of crystal lattice structure between the silicon substrate and the compound materials could result a large number of dislocations and defects and even domain reversion. Furthermore, in the cooling of integrated III-V compound and the silicon-based substrates, the thermal expansion coefficient mismatch will lead to the build-up of high thermal stress producing cracks in the epitaxial layer.

SUMMARY

The present invention provides a method for preparation of an III-V compound substrate on an insulator, comprising: providing a substrate, forming a first dielectric layer on the substrate and forming a first trench on the first dielectric layer to expose the substrate; forming a sacrificial layer on the first dielectric layer covering at least a portion of the first dielectric layer and filling the first trench, and forming a second dielectric layer overlying the sacrificial layer; on the second dielectric layer a groove opening is formed, exposing the sacrificial layer; removing the sacrificial layer, a cavity is formed between the first dielectric layer and the second dielectric layer; growing III-V compound to fill the first trench and the cavity; removing the second dielectric layer, and removing the III-V compounds filled in the first trench and in the second trench which is formed above the first trench; filling the first trench a first dielectric layer, and the second trench an III-V compound.

The present invention can be used to prepare a substrate of III-V compound on a large area insulator, and eliminating defects in the III-V compound layer.

DETAILED DESCRIPTION

Figure 1:
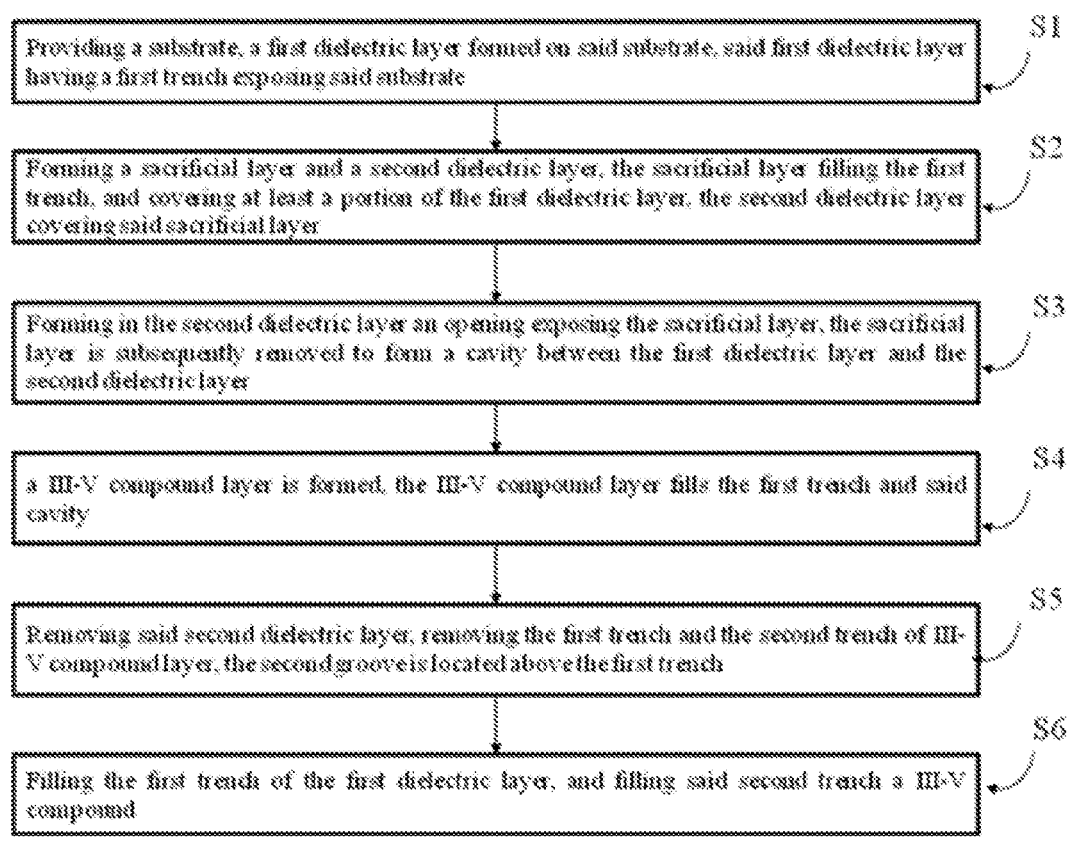
FIG. 1 a process flow diagram of one embodiment of the present invention to prepare III-V compounds on insulator substrate.

The objective of the present invention is to provide a technical solution to the issue of preparing III-V compound substrate on an underlying insulator. The method of preparation comprises:

Providing a substrate, a first dielectric layer formed on said substrate, said first dielectric layer having a first trench exposing said substrate;

Forming a sacrificial layer and a second dielectric layer, the sacrificial layer filling the first trench, and covering at least a portion of the first dielectric layer, the second dielectric layer covering said sacrificial layer;

Forming in the second dielectric layer an opening exposing the sacrificial layer, the sacrificial layer is subsequently removed to form a cavity between the first dielectric layer and the second dielectric layer;

an III-V compound layer is formed, the III-V compound layer fills the first trench and said cavity;

Removing said second dielectric layer, removing the first trench and the second trench of III-V compound layer, the second groove is located above the first trench;

Filling the first trench of the first dielectric layer, and filling said second trench an III-V compound;

The material of the III-V compound layer is GaN, InP, InAs, InSb, or InGaAs;

The III-V compound substrate is prepared using metal organic chemical vapor deposition, atomic layer deposition or molecular beam epitaxy.

The substrate is a single crystal silicon substrate.

The sacrificial layer is amorphous carbon, germanium or silicon-germanium alloy, having a thickness in the range of from 5 nm to 100 nm.

The sacrificial layer is removed using plasma etching.

The first dielectric layer is silicon oxide, having a thickness in the range of from 5 nm to 100 nm.

The second dielectric layer is silicon nitride, having a thickness in the range of from 5 nm to 100 nm.

The second groove has a width greater than the width of the first trench.

The width of the first groove is in the range of from 50 nm to 500 nm, the second groove a width in the range of from 100 nm to 1000 nm.

In the present invention, the method of preparation of III-V compounds on the insulator substrate comprises of forming a layered material structure having a first trench on the first dielectric layer and a grooved second dielectric layer with a sacrificial layer sandwiched in between. A cavity is formed by removing the sacrificial layer between the first dielectric layer and the second dielectric layer. Subsequently, the first trench and the cavity are filled with III-V compound. At this stage, flaws exist between the silicon substrate and the III-V compound due to the mismatch of the crystal structures of the two adjacent materials. Next, lithographically define the defected area and remove by etching the flawed III-V compound in the first trench and a second trench which is located above the first trench. The second trench on the III-V compound layer is for filling in the first trench a first dielectric layer, and III-V compound in the second trench. The method of the present invention can be used to prepare III-V compound layer on a large-area silicon-based insulator. The defects in III-V compound layer are effectively eliminated, providing a basis for fabrication of high-performance semiconductor devices.

Figure 2:
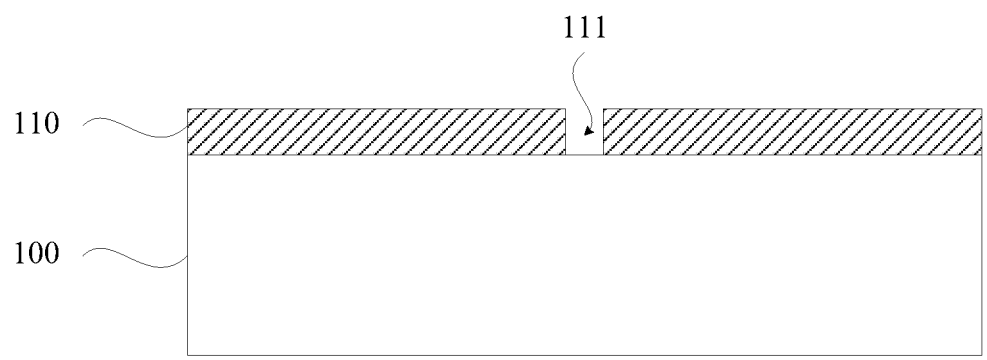
FIGS. 2 to 8 are schematic illustrations showing the processes of preparation of III-V compound substrate on an insulator according to one embodiment of the present invention.

Below is a more detailed description of the present invention on the method of preparation of III-V compound on insulator substrate. The schematic drawing shows a preferred embodiment of the present invention. It should be understood that those skilled in the art may modify the invention described herein, and still achieve beneficial effects of the present invention. Thus, the detailed processes of preparation described should be understood to a person skilled in the art as widely known, but not as a limitation of the present invention. The schematic drawings are provided to aid the description the method of the present invention of preparing III-V compound substrate on the insulator, FIG. 1 is a flowchart describing the procedures of preparation. FIGS. 2 to 9 show cross-section of the substrate structures at different stage of the preparation process. The specific preparation process comprises the following steps:

Step S1, in the embodiment shown in FIG. 2, providing a substrate 100, the substrate 100 is a monocrystalline silicon substrate. Next, a first dielectric layer 110 is formed on the substrate 100, the first dielectric layer 110 is silicon oxide, having a thickness in the range of from 5 nm to 100 nm, for example, a thickness of 20 nm, 30 nm, 50 nm, 80 nm, etc. In the present embodiment, the first dielectric layer 110 is an insulator where III-V compound substrate is subsequently formed served as an intermediate insulating layer. Thereafter, etching the first dielectric layer 110, a first trench 111 is formed in the first dielectric layer 110, the first trench 111 exposing the substrate 100, the first trench 111 is a window for epitaxial growth of III-V compound materials on a silicon substrate.

Figure 3:
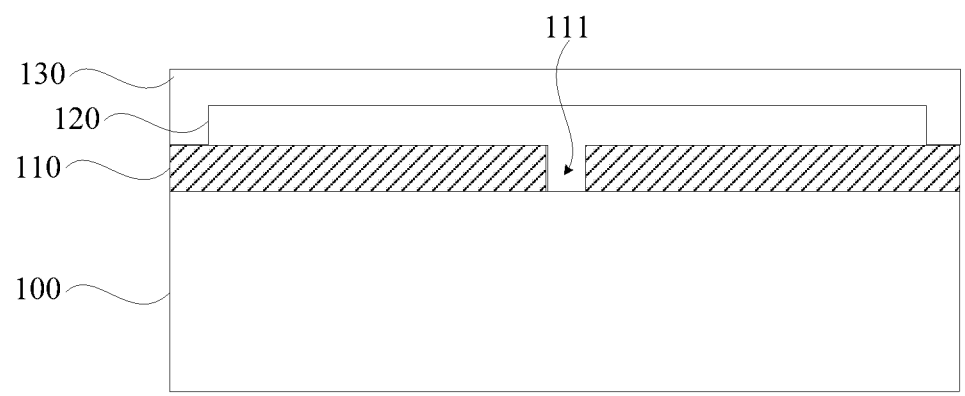

Step S2, shown in FIG. 3 the sacrificial layer 120 and second dielectric layer 130 is sequentially formed on the first dielectric layer 110. The sacrificial layer 120 fills the first trench 111 and covers at least a portion of said first dielectric layer 110. The second dielectric layer 130 covers the sacrificial layer 120 and a portion of the first dielectric layer 110. In the present embodiment, the sacrificial layer 120 is amorphous carbon, germanium, silicon-germanium alloys, photoresist materials or polyimide. The process of depositing the sacrificial layer 120 may be plasma-enhanced chemical vapor deposition (PECVD) or low pressure chemical vapor deposition (LPCVD). The thickness of the sacrificial layer 120 is in the range of from 5 nm to 100 nm. The second dielectric layer 130 is silicon nitride, having a thickness of in the range of from 5 nm to 100 nm. It should be noted that different dielectric materials are used to form the second dielectric layer 130 and the first dielectric layer 110 to avoid the subsequent removal of the second dielectric layer 130 influencing the removal of the first dielectric layer 110.

Figure 4:
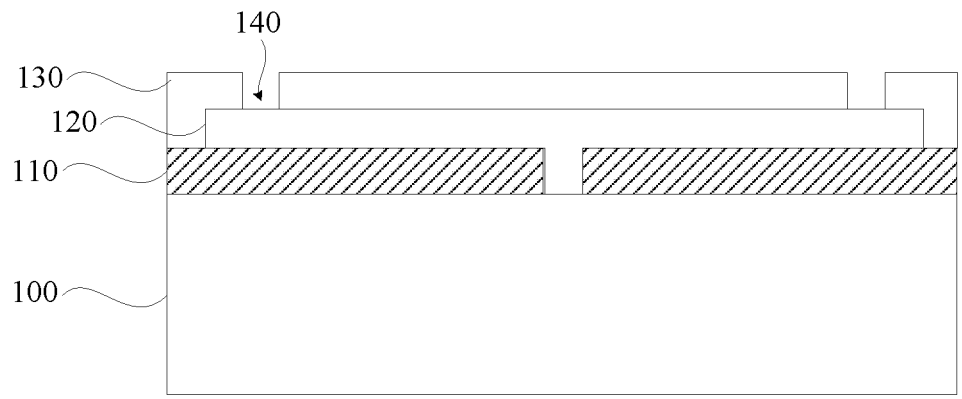

Step S3, with reference to FIG. 4, an opening 140 is formed in the second dielectric layer 130, the opening 140 exposing the sacrificial layer 120. In the present embodiment, the patterned photoresist is formed on the second dielectric layer 130 (not shown), and the patterned photoresist serving as a mask, when plasma etching is used to form opening 140 in the second dielectric layer 130.

Figure 5:
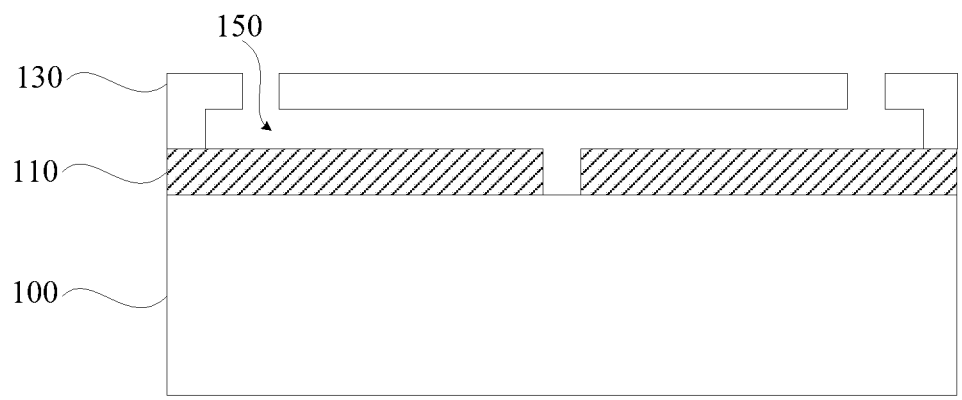

Next, with reference to FIG. 5, the sacrificial layer 120 is removed through the opening 140. Between the first dielectric layer 110 and the second dielectric layer 130, the cavity 150 is formed. In the present embodiment, the sacrificial layer 120 is removed by plasma etching. When the sacrificial layer 120 is amorphous carbon, it is removed using oxygen plasma. The reaction of amorphous carbon and oxygen plasma produces carbon dioxide. The carbon dioxide gas is released from the opening 140.

Figure 6:
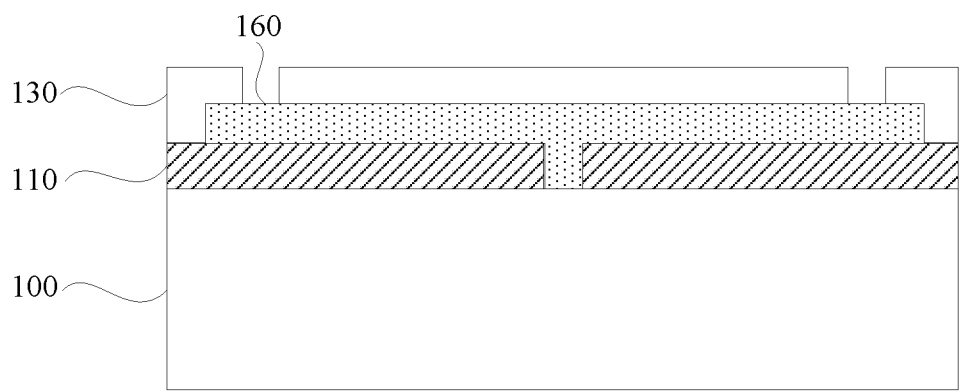

Step S4, with reference to FIG. 6, describes the formation of III-V compound layer 160, filling the first trench 111 and the cavity 150 with III-V compound to form III-V compound layer 160. The material of III-V compound layer 160 is GaN, InP, InAs, InSb, InGaAs, or other commonly known III-V compound. In this embodiment, either metal organic chemical vapor deposition, or atomic layer deposition, or molecular beam epitaxy is used to form the III-V compound layer 160. Due to the nature of selective epitaxy of III-V compound, III-V compound is first deposited on a silicon substrate 100, and grow continuously to fill the first groove 111 and the cavity 150. The mismatches of III-V compound and the silicon substrate 100, in lattice constant, thermal expansion coefficient or lattice structure, cause defects to occur in part of the III-V compound layer 160 which is in contact with the silicon substrate 100. The defects existed in the III-V compounds that fill the first groove 111 will affect the performance of III-V compounds.

Figure 7:
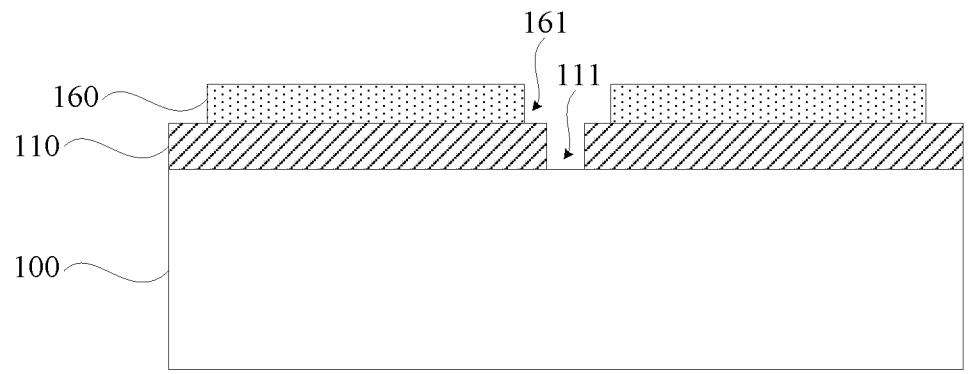

Step S5, with reference to FIG. 7, removing the second dielectric layer 130, etching the III-V compound layer 160 to form a second trench 161 in the III-V compound layer. When the III-V compounds are removed, the formed second trench 161 is located above the first trench 111. In the present embodiment, the removal of the part of III-V compounds in the first trench 111 and second trench 161 is to eliminate the defects of the III-V compounds. In addition, the width of the second trench 161 is wider than the width of the first trench 111, to ensure that the defective III-V compounds are completely removed. The width of the first groove 111 is in the range of from 50 nm to 500 nm, and the width of the second groove 161 is in the range of from 100 nm to 1000 nm. This is to ensure the complete removal of defects of the first groove 111 and to facilitate the subsequent refilling of the first trench 111.

Figure 8:
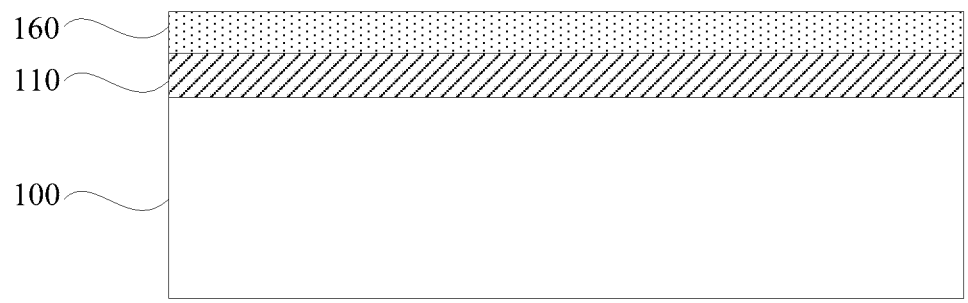

Step S6, with reference to FIG. 8, the first trench 111 is filled with the first dielectric layer 110, the second trench 161 is filled with the III-V compound layer 160, thereby forming III-V compound substrate on an insulator. The structure of III-V compound substrate on insulator includes a substrate 100, a first dielectric layer 110 and an III-V compound layer 160. In the present invention, the III-V compound can be prepared on a large-area insulating substrate, while eliminating the defects in III-V compound layer, and providing a basis for the preparation of high-performance silicon-based compound semiconductor devices.

Figure 9:
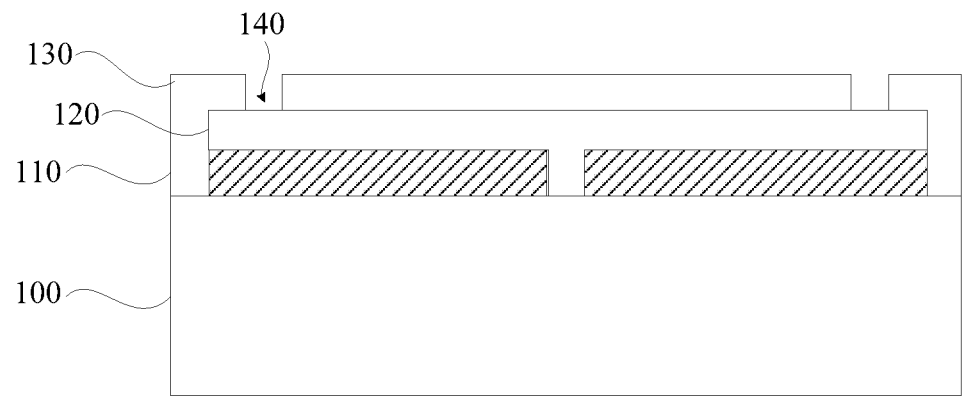
FIG. 9 is a schematic illustration of the process of forming an opening in another embodiment of the present invention.

Furthermore, in the present invention with reference to FIG. 9, the openings are formed in the second dielectric layer 130, the first dielectric layer 110 covers a portion of the substrate 100. The sacrificial layer completely covers the portion of the first dielectric layer, and the second dielectric layer 130 covers the sacrificial layer, as well as portions of the substrate 100. It is to be understood that the process steps of the present embodiment and the process steps of the previous embodiment are the same.

In summary, in the present invention, a cavity is formed by removing the sacrificial layer between the first dielectric layer and the second dielectric layer. When the cavity is filled with III-V compound, flaws exist between the silicon substrate and the III-V compound due to the mismatch of the crystal structures and thermal expansion properties of the two adjacent materials. A second trench is formed by removing the portion of the III-V compound layer. The second trench is located above the first trench. The second trench on the III-V compound layer is provided for filling in the first trench a first dielectric layer, and III-V compound in the second trench. In this way, III-V compound layer is prepared on a large-area insulator. The method of the present invention can be used to prepare III-V compound layer on a large-area silicon-based insulator. The defects in III-V compound are effectively eliminated, providing a basis for fabrication of high-performance semiconductor devices.

For those skilled in the art, it is obvious that variations and modifications to the present invention can be made without departing from the spirit and scope of the invention. Thus, if such modifications and variations are within the spirit and technical scope of the claims of the present invention, the present invention encompass such changes and modifications.

What is claimed is:

1. A method for preparing a III-V compound substrate on an insulator, comprising:
    providing a substrate;
    forming a first dielectric layer on the substrate;
    forming a first trench on the first dielectric layer to expose the substrate;
    forming a sacrificial layer on the first dielectric layer, the sacrificial layer covering a first portion of the first dielectric layer and filling the first trench;
    forming a second dielectric layer on the sacrificial layer, the second dielectric layer covering the sacrificial layer and a second portion of the first dielectric;
    on the second dielectric layer forming a groove such that an opening of the groove exposes the sacrificial layer, wherein the groove does not penetrate into the sacrificial layer;
    removing the sacrificial layer through the opening of the groove, wherein a cavity is formed between the first dielectric layer and the second dielectric layer;
    growing III-V compounds to fill the first trench and the cavity;
    removing the second dielectric layer;
    removing the III-V compounds filled in the cavity to form a second trench, the second trench being above the first trench;
    removing the III-V compounds filled in the first trench; and
    filling the first trench with a first dielectric layer, and the second trench with a III-V compound.

2. The method of claim 1, wherein a material of the III-V compound substrate is GaN, InP, InAs, InSb, or InGaAs.

3. The method of claim 2, wherein the III-V compound substrate is prepared using metal organic chemical vapor deposition, atomic layer deposition or molecular beam epitaxy.

4. The method of claim 1, wherein the said substrate is a single crystal silicon substrate.

5. The method of claim 1, wherein the sacrificial layer is amorphous carbon, germanium or silicon-germanium alloy, having a thickness in the range of from 5 nm to 100 nm.

6. The method of claim 1, wherein the sacrificial layer is removed by plasma etching.

7. The method of claim 1, wherein said first dielectric layer is silicon oxide, having a thickness in the range of from 5 nm to 100 nm.

8. The method of claim 1, wherein said second dielectric layer is silicon nitride, having a thickness in the range of from 5 nm to 100 nm.

9. The method of claim 1, wherein said a width of the second trench is greater than a width of the first trench.

10. The method of claim 9, wherein the width of the first trench is in the range of from 50 nm to 500 nm, the width of the second trench is in the range of from 100 nm to 1000 nm.

* * * * *